United States Patent
Johnson et al.

(10) Patent No.: US 6,174,407 B1
(45) Date of Patent: Jan. 16, 2001

(54) APPARATUS AND METHOD FOR DETECTING AN ENDPOINT OF AN ETCHING PROCESS BY TRANSMITTING INFRARED LIGHT SIGNALS THROUGH A SEMICONDUCTOR WAFER

(75) Inventors: Gregory A. Johnson; Kunal N. Taravade, both of Colorado Springs, CO (US)

(73) Assignee: LSI Logic Corporation, Milpitas, CA (US)

(*) Notice: Under 35 U.S.C. 154(b), the term of this patent shall be extended for 0 days.

(21) Appl. No.: 09/204,767

(22) Filed: Dec. 3, 1998

(51) Int. Cl.[7] ............................. C23F 1/02; H01L 21/302
(52) U.S. Cl. ................. 156/345; 118/723 E; 118/723 IR
(58) Field of Search ........................ 156/345; 118/723 E, 118/723 IR, 728

(56) References Cited

U.S. PATENT DOCUMENTS

| | | | |
|---|---|---|---|
| 4,198,261 | 4/1980 | Busta et al. | 156/626 |
| 4,482,424 | 11/1984 | Katzir et al. | 156/626 |
| 4,822,718 | 4/1989 | Latham et al. | 430/271 |
| 4,846,920 | 7/1989 | Keller et al. | 156/345 |
| 4,998,021 | 3/1991 | Mimasaka | 250/560 |
| 5,139,918 | 8/1992 | Goel | 430/166 |
| 5,190,614 | 3/1993 | Leach et al. | 156/626 |
| 5,198,072 | 3/1993 | Gabriel | 156/627 |
| 5,261,998 | 11/1993 | Kanetake et al. | 156/626 |
| 5,288,367 | 2/1994 | Angell et al. | 156/626 |
| 5,392,124 | 2/1995 | Barbee et al. | 356/381 |
| 5,427,878 | 6/1995 | Corliss | 430/30 |
| 5,641,608 | 6/1997 | Grunwald et al. | 430/302 |
| 5,643,700 | 7/1997 | Otsuka | 430/30 |
| 5,658,418 | 8/1997 | Coronel et al. | 156/345 |
| 5,695,660 | 12/1997 | Litvak | 216/85 |
| 5,731,123 | 3/1998 | Kawamura et al. | 430/176 |
| 5,773,206 | 6/1998 | Hershey et al. | 430/510 |
| 5,777,739 | 7/1998 | Sandhu et al. | 356/357 |
| 5,814,431 | 9/1998 | Nagasaka et al. | 430/281.1 |

FOREIGN PATENT DOCUMENTS

| | | | |
|---|---|---|---|
| 58-025478 | * | 2/1983 | (JP). |
| 58-064384 | * | 4/1983 | (JP). |
| 60-082681 | * | 5/1985 | (JP). |
| 62-190728 | * | 8/1987 | (JP). |
| 4-206927 | * | 7/1992 | (JP). |
| 4-219930 | * | 8/1992 | (JP). |
| 4-371588 | * | 12/1992 | (JP). |
| 10-209127 | * | 8/1998 | (JP). |

\* cited by examiner

*Primary Examiner*—Gregory Mills
*Assistant Examiner*—George Goudreau

(57) ABSTRACT

An apparatus for etching a first side of a semiconductor wafer down to a desired level. The apparatus includes an etching chamber. The apparatus also includes a wafer chuck configured to engage the wafer by a second side of the wafer, and position the wafer in the etching chamber. The apparatus also includes a light source unit positioned such that light signals generated by the light source unit are directed into the wafer. Moreover, the apparatus includes a light receiving unit positioned such that the light signals generated by the light source unit emanate out of the wafer and are received with the light receiving unit. The light receiving unit includes a first optical material and a second optical material having an interface therebetween. The first optical material has a linear index of refraction, whereas the second optical material has a nonlinear index of refraction which is dependent on an intensity level of the light signals received with the light receiving unit. The light signals are refracted at the interface if the linear index of refraction of the first optical material does not match the nonlinear index of refraction of the second optical material. A method of etching a first side of a semiconductor down to a desired level is also disclosed.

14 Claims, 4 Drawing Sheets

APPARATUS AND METHOD FOR DETECTING AN ENDPOINT OF AN ETCHING PROCESS BY TRANSMITTING INFRARED LIGHT SIGNALS THROUGH A SEMICONDUCTOR WAFER

TECHNICAL FIELD OF THE INVENTION

The present invention relates generally to an apparatus and method for detecting an endpoint of an etching process, and more particularly to an apparatus and method for detecting an endpoint of an etching process by transmitting infrared light signals through a semiconductor wafer.

BACKGROUND OF THE INVENTION

The manufacture of semiconductor wafers to create semiconductor integrated circuit devices typically involves a sequence of processing steps which fabricate the multi-layer structure generally associated with the integrated circuit devices. Such processing steps may include (1) the deposition of metals, dielectrics, and semiconductor films, (2) the creation of masks by lithography techniques, (3) the doping of semiconductor layers by diffusion or implantation, (4) the polishing of outer layers (e.g. chemical-mechanical polishing), and (5) the etching of layers for selective or blanket material removal.

There is a continuing trend in the semiconductor industry to increase the functionality and performance of integrated circuit devices by increasing the number of circuit components within a given integrated circuit device. While in certain cases this may be accomplished by increasing the size of the integrated circuit device, in most cases this is accomplished by reducing the size and increasing the density of the circuit components.

Numerous manufacturing techniques have heretofore been developed in an effort to accomplish such component size reductions and density increases. For example, dry etch processes have been developed which do not require the immersion of the semiconductor wafer into an etching liquid. The most common dry etch process, generally referred to as "plasma etching", utilizes plasma to etch films on the semiconductor wafer. Another type of dry etching, generally referred to as "dry developing", utilizes a reactant gas to etch resist films from the semiconductor wafer.

In such dry etch processes, it is generally desirable to predict or detect when the desired layer of material associated with the semiconductor wafer has been etched away. In particular, it is desirable to detect when the semiconductor wafer has been etched to a desired level or "endpoint". For example, systems have heretofore been designed which monitor the emission spectra of the plasma during plasma etching. However, such systems are typically complex and require expensive analysis equipment for operation thereof.

Thus, a continuing need exists for an apparatus and method which accurately and efficiently detects when an etching system etches a semiconductor wafer down to a desired level.

SUMMARY OF THE INVENTION

In accordance with a first embodiment of the present invention, there is provided a method of etching a first side of a semiconductor wafer down to a desired level. The method includes the step of etching the first side of the wafer in order to remove material from the wafer. The method also includes the step of transmitting a light signal through the first side of the wafer during the etching step such that the light signal propagates through the wafer and causes an attenuated signal to be emanated out of a second side of the wafer. The method further includes the step of refracting the attenuated signal if an intensity level of the attenuated signal has a predetermined relationship with an intensity threshold level. Moreover, the method includes the step of stopping the etching step in response to the attenuated signal being refracted in the refracting step.

Pursuant to a second embodiment of the present invention, there is provided an apparatus for etching a first side of a semiconductor wafer down to a desired level. The apparatus includes an etching chamber. The apparatus also includes a wafer chuck configured to engage the wafer by a second side of the wafer, and position the wafer in the etching chamber. The apparatus also includes a light source unit positioned such that light signals generated by the light source unit are directed toward the wafer. Moreover, the apparatus includes a light receiving unit positioned such that the light signals generated by the light source unit emanate from the wafer and are received with the light receiving unit, wherein the light signals are refracted by the light receiving unit when the wafer has been etched down to the desired level.

Pursuant to a third embodiment of the present invention, there is provided an apparatus for etching a first side of a semiconductor wafer down to a desired level. The apparatus includes an etching chamber. The apparatus also includes a wafer chuck configured to engage the wafer by a second side of the wafer, and position the wafer in the etching chamber. The apparatus also includes a light source unit positioned such that light signals generated by the light source unit are directed into the wafer. Moreover, the apparatus includes a light receiving unit positioned such that the light signals generated by the light source unit emanate out of the wafer and are received with the light receiving unit. The light receiving unit includes a first optical material and a second optical material having an interface therebetween. The first optical material has a linear index of refraction, whereas the second optical material has a nonlinear index of refraction which is dependent on an intensity level of the light signals received with the light receiving unit. The light signals are refracted at the interface if the linear index of refraction of the first optical material does not match the nonlinear index of refraction of the second optical material.

It is an object of the present invention to provide a new and useful apparatus and method for determining an endpoint of an etching process.

It is an object of the present invention to provide an improved apparatus and method for determining an endpoint of an etching process.

It is a further object of the present invention to provide an apparatus and method for determining that an etching system has etched a wafer down to a desired level without removing the wafer from the etching system.

The above and other objects, features, and advantages of the present invention will become apparent from the following description and the attached drawings.

DETAILED DESCRIPTION OF A PREFERRED EMBODIMENT

Figure 1A:
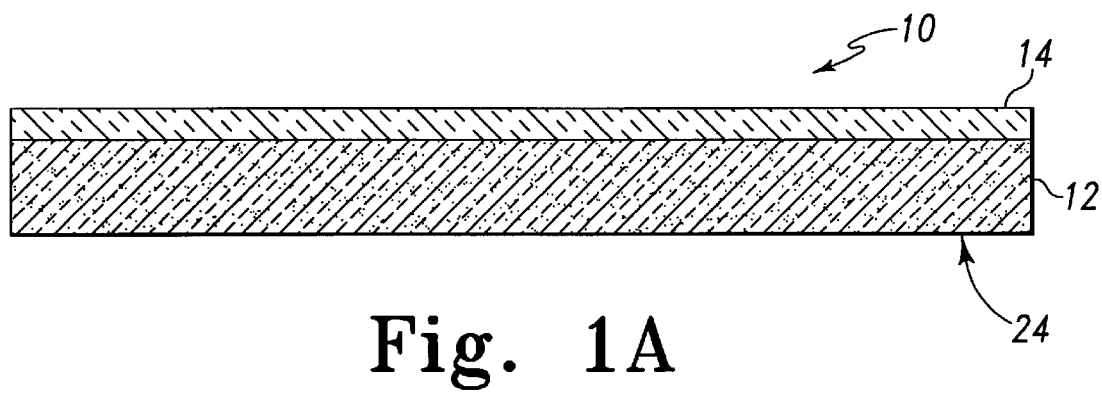
FIGS. 1A–1D show sectional views of a semiconductor wafer during various steps of a fabrication process.

While the invention is susceptible to various modifications and alternative forms, a specific embodiment thereof has been shown by way of example in the drawings and will herein be described in detail. It should be understood, however, that there is no intent to limit the invention to the particular form disclosed, but on the contrary, the intention is to cover all modifications, equivalents, and alternatives falling within the spirit and scope of the invention as defined by the appended claims.

Figure 1B:
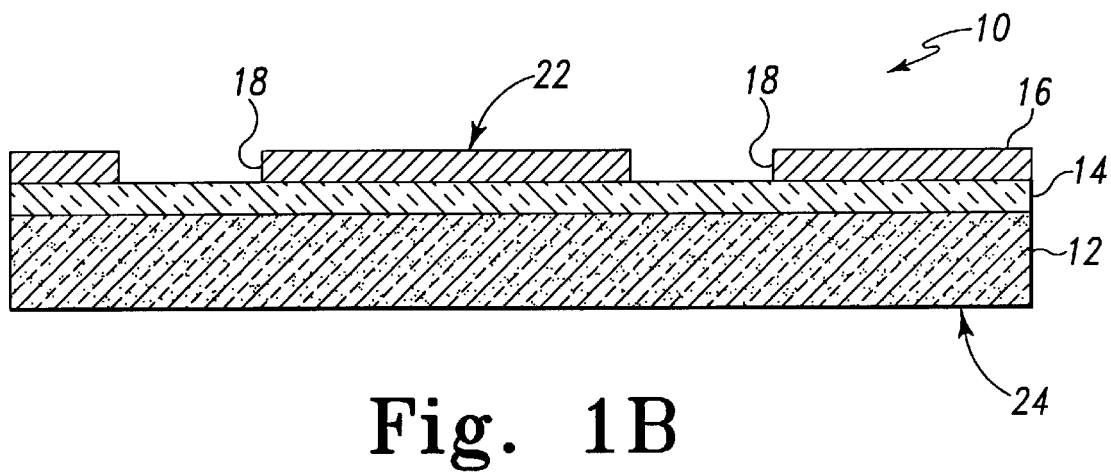

Referring now to FIGS. 1A–1D, there is shown a semiconductor wafer 10 after various steps of a fabrication process of the present invention. As shown in FIGS. 1A and 1B, the semiconductor wafer 10 includes a semiconductor substrate 12, such as silicon. An oxide layer 14 (e.g. silicon dioxide) is initially deposited or otherwise disposed on the semiconductor substrate 12. Thereafter, the fabrication process patterns a resist layer 16 over the oxide layer 14. In particular, the resist layer 16 is patterned onto the oxide layer such that a pair of holes 18 are defined therein.

Figure 1C:
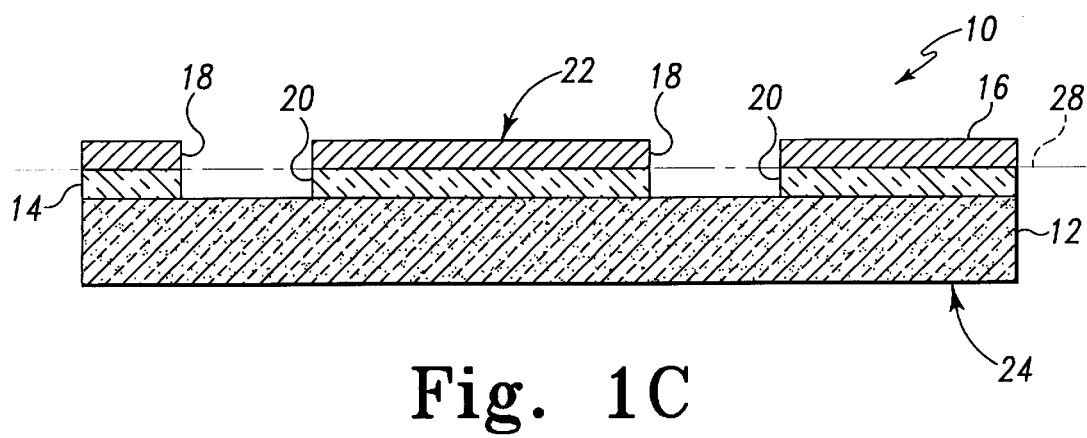
Figure 1D:
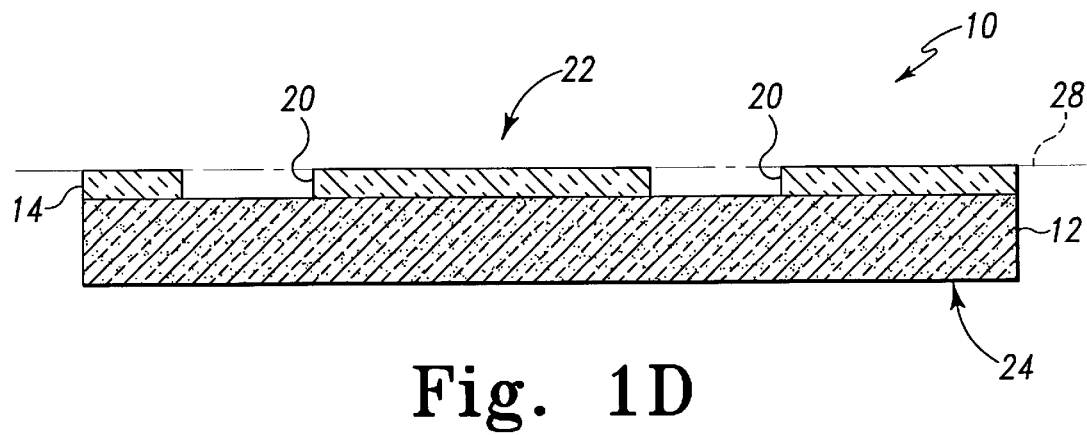

As shown in FIG. 1C, the semiconductor wafer 10 is then etched such that the portions of the oxide layer 14 not covered by the resist layer 16 (i.e. the portion of the oxide layer below the holes 18) are etched away thereby forming a pair of via holes 20 in the oxide layer 14. After the via holes 20 have been etched or otherwise defined in the oxide layer 14, it may be desirable to etch the remainder of the resist layer 16 from the semiconductor wafer 10. As shall be discussed below in more detail, in order to remove the remainder of the resist layer 16, an etching system, such as an etching system 30 of FIG. 2, etches the resist layer 14 down to a desired level 28 thereby removing substantially all of the resist layer 16 (see FIG. 1D).

Figure 2:
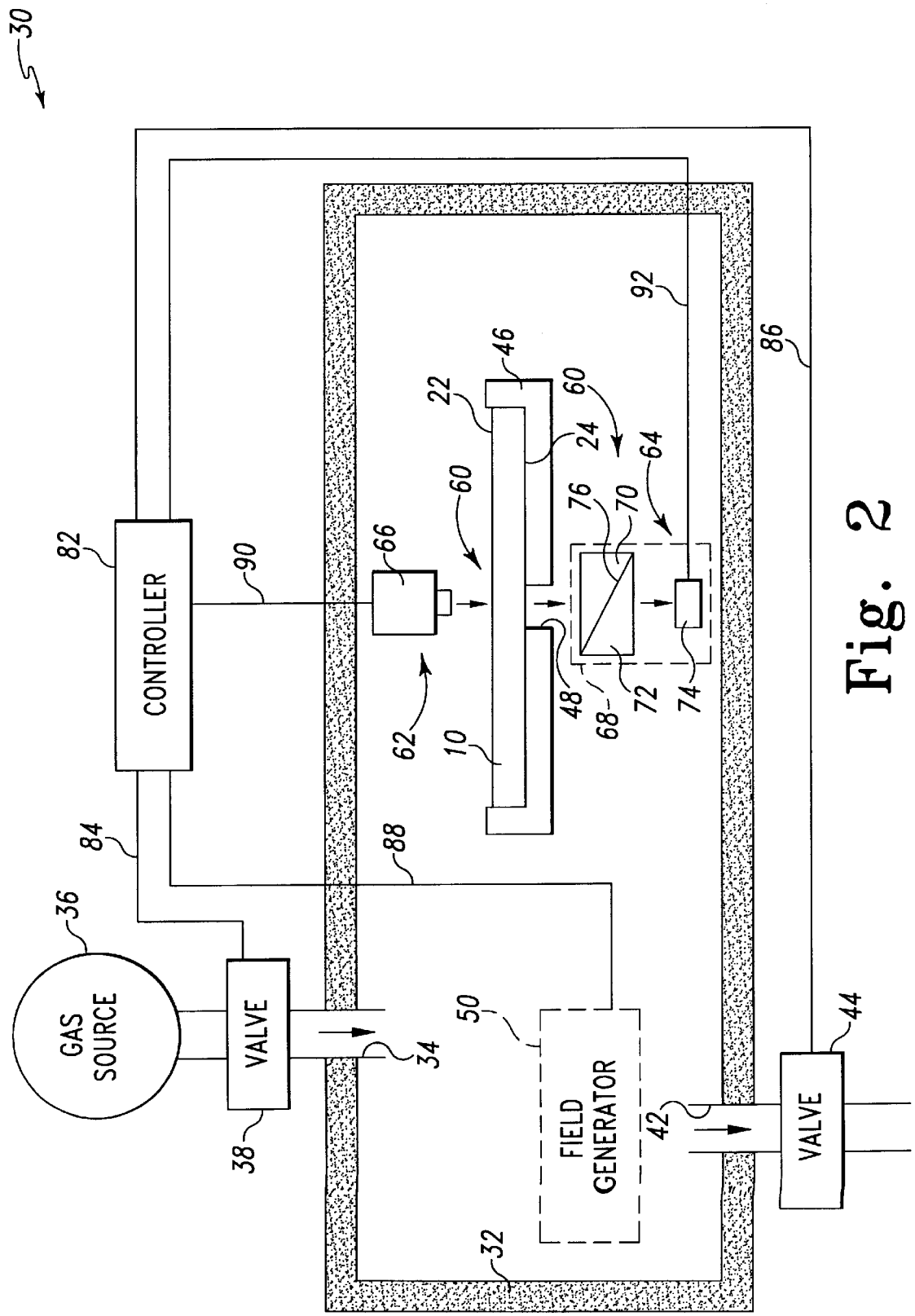
FIG. 2 shows an etching system which incorporates various features of the present invention therein.

Referring now to FIG. 2, there is shown a preferred embodiment of the etching system 30 which is used to etch a front side or surface 22 of the semiconductor wafer 10. The etching system 30 includes an etching chamber 32. The etching chamber 32 has a gas inlet 34 which is fluidly coupled to a gas source 36 in order to provide for a flow of a reactant gas (or gases) into the etching chamber 32. The gas inlet 34 has an inlet valve 38 associated therewith which controls the flow of reactant gas from the gas source 36. In particular, the inlet valve 38 is positionable between an open position and a closed position. When the inlet valve 38 is positioned in its open position, reactant gas is permitted to flow from the gas source 36 into the etching chamber 32. Conversely, when the inlet valve 38 is positioned in its closed position, the gas source 36 is isolated from the etching chamber 32 thereby preventing a flow of reactant gas into the etching chamber 32.

Moreover, the etching chamber 32 also has a gas outlet 42 which is fluidly coupled to a vacuum pump (not shown) and a gas collection device (not shown) in order to selectively (1) reduce pressure within the etching chamber 32 to a predetermined pressure level, and (2) evacuate the reactant gas from the etching chamber 32. The gas outlet 42 has an outlet valve 44 associated therewith which controls the flow of reactant gas from the etching chamber 32 to the gas collection device. In particular, the outlet valve 44 is positionable between an open position and a closed position. When the outlet valve 44 is positioned in its open position, reactant gas is permitted to flow from the etching chamber 32 to the gas collection device. Conversely, when the outlet valve 44 is positioned in its closed position, the etching chamber 32 is isolated from the gas disposal device thereby preventing a flow of reactant gas into the gas disposal device.

The etching system 30 also includes a wafer chuck 46 which engages a back side or surface 24 of the semiconductor wafer 10 and thereafter positions the wafer 10 at a predetermined position within the etching chamber 32. The wafer chuck 46 has an opening 48 defined therein. The opening 48 is provided to allow light signals to pass through the wafer chuck 46. It should be appreciated that the opening 48 may be covered with a protective covering so as to prevent gas or debris from advancing into the opening 48. As shall be discussed below in more detail, light signals advancing through the opening 48 may be utilized to determine when the semiconductor wafer 10 has been etched down to the desired level 28.

The wafer chuck 46 may have a cooling mechanism (not shown) associated therewith which counteracts heat generated during the etching process in order to maintain the back side 24 of the semiconductor wafer 10 within a predetermined temperature range.

The etching system 30 also includes an electric field generating device 50 for generating an electric field within the etching chamber 32. Such an electric field breaks down the reactant gases within the etching chamber 32 thereby generating a plasma. Reactive species within the plasma etch the wafer material that is desired to be removed (e.g. the remaining resist layer 16). In a known manner, the electric field generating device 50 may produce an electric field at various frequencies such as RF or microwave frequencies.

The etching system 30 further includes an endpoint detection system 60. As shown in FIG. 2, the endpoint detection system 60 includes a light source array 62 and a light receiver array 64. The light source array 62 is secured above the wafer chuck 46 and includes an infrared light source unit 66. In particular, the infrared light source unit 66 is secured within the etching chamber 32 such that infrared light signals generated by the light source unit 66 are directed toward the front side 22 of the semiconductor wafer 10. It should be appreciated that the infrared light source unit 66 may alternatively be secured outside of the etching chamber 32 such that infrared light signals are first directed through a sapphire window or the like positioned in an upper wall of the etching chamber 32 and thereafter impinged upon the front side 22 of the semiconductor wafer 10.

The light receiver array 64 includes a light receiving unit 68 that is secured to or otherwise positioned below the wafer chuck 46. In particular, the light receiving unit 68 is positioned such that light signals emanating out of the opening 48 defined in the wafer chuck 46 are received by the light receiving unit 68. As discussed further below, the intensity level of light signals received by the light receiving unit 68 may be monitored in order to determine when the semiconductor wafer 10 has been etched down to the desired level 28.

As shown in FIG. 2, the light receiving unit 68 includes a first or linear optical material 70, a second or nonlinear optical material 72, and an infrared light detector 74. The linear optical material 70 and the nonlinear optical material 72 have a planar interface 76 therebetween. Infrared light signals received through the opening 48 of the wafer chuck 46 pass through the optical materials 70, 72 and into the light detector 74.

The linear optical material 70 has a linear index of refraction, whereas the nonlinear optical material 72 has a nonlinear index of refraction. In particular, the index of refraction of the linear optical material 70 remains constant irrespective of the intensity level of the infrared light passing therethrough. Hence, as the intensity level of the infrared light signals received through the opening 48 of the wafer chuck 46 varies, the index of refraction of the linear optical material 70 remains constant. Suitable optical materials for use as the linear optical material 70 of the present invention include glass or quartz.

The index of refraction of the nonlinear optical material 72 varies based on the intensity level of the infrared light passing therethrough. In particular, if the intensity level of the infrared light passing through the nonlinear optical material 72 is below a predetermined intensity threshold value, the index of refraction of the nonlinear optical material 72 remains constant. However, if the intensity level of the infrared light passing through the nonlinear optical material 72 is above the intensity threshold value, the index of refraction of the nonlinear optical material 72 changes. Hence, if the intensity level of the infrared light signals received through the opening 48 of the wafer chuck 46 is below the intensity threshold value, the index of refraction of the nonlinear optical material 70 remains constant. However, if the intensity level of the infrared light signals received through the opening 48 of the wafer chuck 46 is equal to or above the threshold value, the index of refraction of the nonlinear optical material 70 changes. Suitable optical materials having nonlinear indices of refraction for use as the nonlinear optical material 72 of the present invention are the nonlinear optical materials disclosed in U.S. Pat. No. 5,561,541 entitled "Frustrated Total Internal Reflection Optical Power Limiter" which was issued on Oct. 1, 1996 to Sharp et al, the disclosure of which is hereby incorporated by reference.

The nonlinear optical material 72 preferably has an index of refraction which matches the index of refraction of the linear optical material 70 when the intensity level of the infrared light passing therethrough is below the intensity threshold level. What is meant herein by the terms "match" or "matches" is that the index of refraction of a first material is either equal to, or within a predetermined tolerance range of, the index of refraction of a second material. It should be appreciated that if the index of refraction of the linear optical material 70 matches the index of refraction of the nonlinear optical material 72, infrared light passing therethrough is unattenuated by the optical materials 70, 72. However, if the index of refraction of the linear optical material 70 does not match the index of refraction of the nonlinear optical material 72, infrared light passing therethrough is refracted at the planar interface 76 between the optical materials 70, 72. What is meant herein by the terms "refract", "refracts", "refracted", "refracting", or "refraction" is the bending or redirecting of the infrared light passing through the optical materials 70, 72 such that presence of the infrared light is not detected by the light detector 74. As shall be discussed below in greater detail, such refraction of the infrared light passing through the optical materials 70, 72 is indicative of the semiconductor wafer 10 having been etched down to the desired level 28.

It should be appreciated that the light source unit 66 may be configured to produce infrared light at an intensity level which facilitates endpoint detection of the semiconductor wafer 10 during etching thereof. In particular, the light source unit 66 produces infrared light which passes through the semiconductor wafer 10. The intensity level of the infrared light is attenuated or otherwise reduced as the light passes through the semiconductor wafer 10. The degree or magnitude of such attenuation of the intensity level of the infrared light is dependent on the thickness of the semiconductor wafer 10. In particular, as the thickness of the semiconductor wafer 10 decreases due to etching thereof, the degree of attenuation or reduction of the intensity level of the infrared light likewise decreases. Hence, the intensity level of infrared light which has passed through an etched (i.e. thinner) semiconductor wafer 10 is greater relative to the intensity level of infrared light which has passed through an unetched (i.e. thicker) semiconductor wafer 10.

Prior to being etched to the desired level 28 (see FIG. 1C), the thickness of the semiconductor wafer 10 causes the intensity of the infrared light from the light source unit 66 to be attenuated or reduced to an intensity level which is below the intensity threshold level of the nonlinear optical material 72. Hence, prior to being etched to the desired level 28, infrared light passes unattenuated through the optical materials 70, 72 and into the light detector 74. However, once the semiconductor wafer 10 has been etched to the desired level 28 (see FIG. 1D), the intensity level of the infrared light passing therethrough is greater in magnitude than the intensity threshold level of the nonlinear optical material 72 thereby causing the index of refraction of the nonlinear optical material 72 to be changed. Once changed in such a manner, the index of refraction of the nonlinear optical material 72 no longer matches the index of refraction of the linear optical material 70 thereby causing the infrared light passing therethrough to be refracted. Such refraction prevents infrared light from the light source unit 66 from being detected by the light detector 74. As shall be discussed below in more detail, such detection (or lack thereof) may be used to alter operation of the etching system 30.

The etching system 30 also includes a controller 82 for controlling the etching system 30 in order to effectuate the desired etching results for the semiconductor wafer 10. In particular, the controller 82 is electrically coupled to the inlet valve 38 via a signal line 84. The controller 82 may selectively generate a control signal on the signal line 84 thereby causing the inlet valve 38 to selectively be moved between its open position and its closed position. Hence, when the controller 82 generates an output signal in order to position the inlet valve 38 in its open position, reactant gas is permitted to flow from the gas source 36 into the etching chamber 32. Conversely, when the controller 82 generates an output signal in order to position the inlet valve 38 in its closed position, the gas source 36 is isolated from the etching chamber 32 thereby preventing a flow of reactant gas into the etching chamber 32.

The controller 82 is also electrically coupled to the outlet valve 44 via a signal line 86. The controller 82 may selectively generate a control signal on the signal line 86 in order to selectively move the outlet valve 44 between its open position and its closed position. Hence, when the controller 82 generates an output signal in order to position the outlet valve 44 in its open position, reactant gas is permitted to flow from the etching chamber 32 to the gas collection device (not shown). Conversely, when the controller 82 generates an output signal in order to position the outlet valve 44 in its closed position, the etching chamber 32 is isolated from the gas disposal device thereby preventing a flow of reactant gas into the gas disposal device.

Moreover, the controller 82 is also electrically coupled to the electric field generating device 50 via a signal line 88. Hence, the controller 82 may selectively generate a control signal on the signal line 88 in order to selectively actuate and/or deactuate the electric field generating device 50 thereby selectively generating an electric field within the etching chamber 32.

The controller 82 is also electrically coupled to the infrared light source unit 66 via a signal line 90 in order to selectively actuate the light source unit 66. In particular, as shown in FIG. 2, during operation of the etching system 30, the controller 82 generates a control signal on the signal line 90 which causes the light source unit 66 to generate infrared light signals which are transmitted through the semiconductor wafer 10 and into the opening 48 of the wafer chuck 46.

The controller 82 is electrically coupled to the light detector 74 of the light receiving unit 68 via a signal line 92 in order to monitor the output therefrom. In particular, as discussed above, if the semiconductor wafer 10 has not been etched down to the desired level 28, the intensity level of the infrared light passing through the semiconductor wafer 10 (i.e. the infrared light signals generated by the light source unit 66) after the same has been attenuated by the semiconductor wafer 10 is below the intensity threshold level of the nonlinear optical material 72. In such a case, the infrared light passes unattenuated through the linear optical material 70 and the nonlinear optical material 72 and thereafter posses an intensity level which is above the detection threshold of the light detector 74 thereby allowing the light detector 74 to detect presence thereof. Upon detection of infrared light, the light detector 74 of the light receiving unit 68 is operated in a light detected mode of operation in which the light detector 74 generates a detection control signal which is sent to the controller 82 via the signal line 92.

However, if the semiconductor wafer 10 has been etched down to the desired level 28, the intensity level of the infrared light passing through the semiconductor wafer 10 (i.e. the infrared light signals generated by the light source unit 66) after the same has been attenuated by the semiconductor wafer 10 is above the intensity threshold level of the nonlinear optical material 72. In such a case, the index of refraction of the nonlinear optical material 72 is changed so as not to match the index of refraction of the linear optical material 70. Hence, the infrared light signals are refracted at the planar interface 76 between the linear optical material 70 and the nonlinear optical material 72. After such refraction, infrared light signals are not detected by the light detector 74. Hence, the light detector 74 of the light receiving unit 68 is operated in a no-light mode of operation in which the light detector 74 does not generate a detection control signal to be sent to the controller 82.

Absence of a detection control signal on the signal line 92 causes the controller 82 to stop or otherwise cease etching of the semiconductor wafer 10. In particular, if the controller 82 does not receive a detection control signal on the signal line 92, the controller 82 positions the inlet valve 38 in its closed position so as to prevent a flow of reactant gas from advancing into the etching chamber 32 thereby ceasing etching of the front side 22 of the semiconductor wafer 10.

In operation, the etching system 30 etches the semiconductor wafer 10 in order to remove material from the front side 22 thereof. In particular, the etching system 30 removes material from the front side 22 of the semiconductor wafer 10 until the wafer 10 is etched down to the desired level 28. More specifically, the wafer chuck 46 engages the back side 24 of the semiconductor wafer 10 and positions the semiconductor wafer 10 at a predetermined position within the etching chamber 32. The controller 82 then causes the inlet valve 38 to be positioned in its open position thereby providing for a flow of reactant gas into the etching chamber 32. Thereafter, the controller 82 causes actuation of the electric field generating device 50 thereby creating an electric field within the etching chamber 32. The resulting plasma generated from the reactant gas in the presence of the electric field etches or otherwise removes material from the front side 22 of the semiconductor wafer 10.

In addition, the controller 82 selectively causes the infrared light source unit 66 to generate light signals of infrared light which are transmitted through the front side 22 of the semiconductor wafer 10. The controller 82 also monitors the output from the light detector 74 associated with the light receiving unit 68 in order to monitor the changing (i.e. decreasing) thickness of the semiconductor wafer 10. From such monitoring of the light detector 74, the controller 82 determines if the semiconductor wafer 10 has been etched to the desired level 28 and thereafter ceases etching of the wafer 10 if it has been etched to the desired level 28. In particular, if the semiconductor wafer 10 has been etched to the desired level 28, the controller 82 may (1) cause the inlet valve 38 to be positioned in its closed position thereby preventing additional reactant gas from being advanced into the etching chamber 32, (2) deactuate the electric field generating device 50 thereby removing the electric field from within the etching chamber 32, and/or (3) cause the outlet valve 44 to be positioned in its open position thereby causing the reactant gas (and the plasma generated therefrom) to be evacuated from the etching chamber 32 via the outlet 42.

Figure 3:
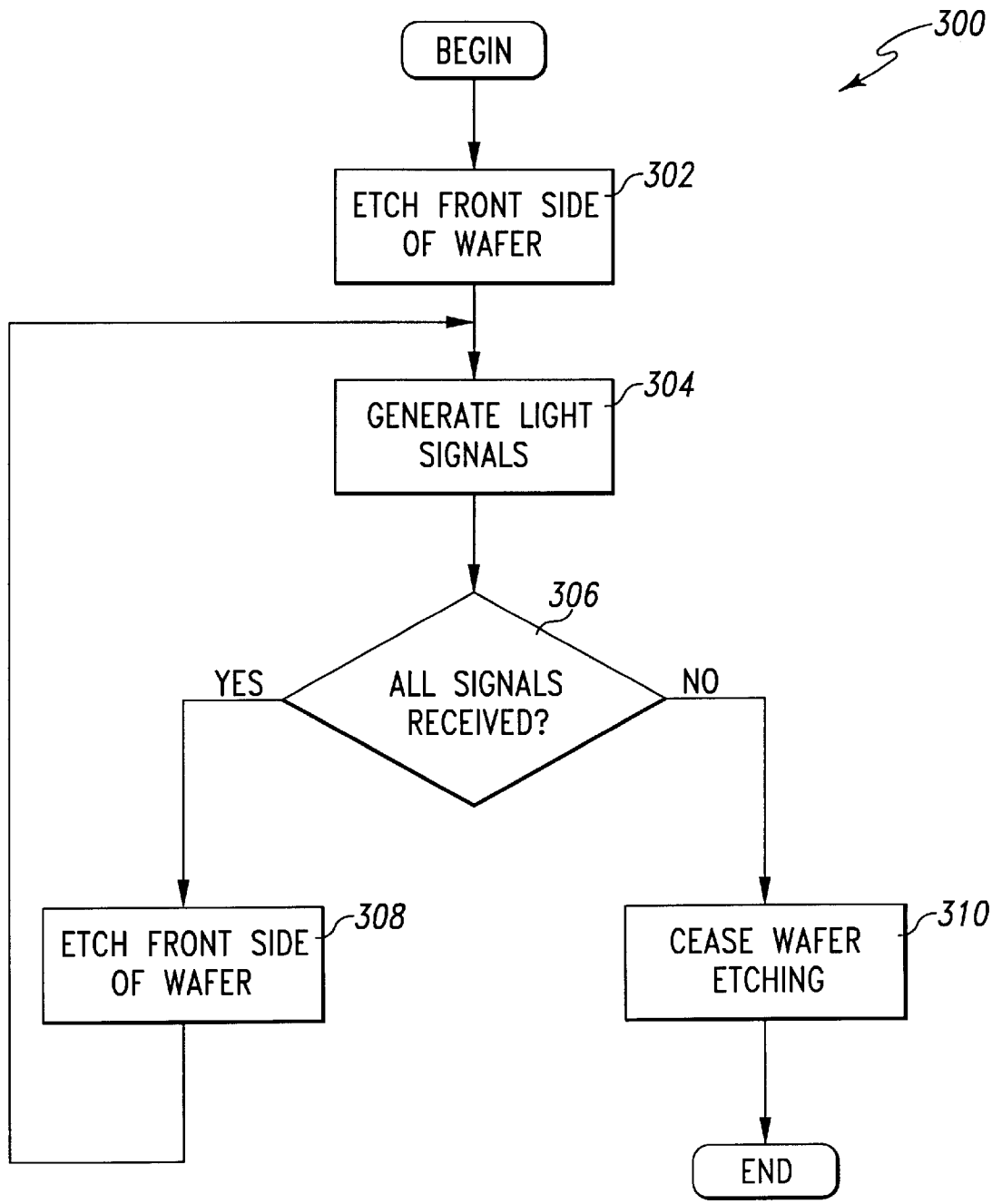
FIG. 3 shows a flowchart of an etching procedure used by the etching system of FIG. 2.

An etching procedure 300 utilized by the etching system 30 to etch the semiconductor wafer 10 according to the present invention is shown in FIG. 3. The etching procedure 300 begins with step 302 in which the controller 82 causes the etching system 30 to begin etching the front side 22 of the semiconductor wafer 10 in order to remove material therefrom. In particular, the wafer chuck 46 engages the back side 24 of the semiconductor wafer 10 and positions the semiconductor wafer 10 at a predetermined position within the etching chamber 32. The controller 82 then causes the inlet valve 38 to be positioned in its open position thereby providing for a flow of reactant gas into the etching chamber 32. Thereafter, the controller 82 causes actuation of the electric field generating device 50 thereby creating an electric field within the etching chamber 32. The resulting plasma generated from the reactant gas in the presence of the electric field etches or otherwise removes material from the front side 22 of the semiconductor wafer 10. The procedure 300 then advances to step 304.

In step 304, the controller 82 causes the light source unit 66 to generate infrared light signals. In particular, the controller 82 generates an output signal on the signal line 90 which causes the light source unit 66 to generate infrared light signals. Such infrared light signals are transmitted through the semiconductor wafer 10 and into the opening 48 of the wafer chuck 46. The procedure 300 then advances to step 306.

In step 306, the controller 82 determines if the infrared light signals generated by the light source unit 66 are detected by the light receiving unit 68. In particular, as discussed above, if the semiconductor wafer 10 has not been etched to the desired level 28, infrared light corresponding to the light signals generated by the light source unit 66 is detected by the light detector 74 of the light receiving unit 68. Hence, in step 306, if infrared light is detected by the light detector 74 of the light receiving unit 68, the procedure 300 advances to step 308. If infrared light is not detected by the light detector 74 of the light receiving unit 68, the procedure 300 advances to step 310.

In step 308, the controller 82 concludes that the semiconductor wafer 10 has not been etched to the desired level 28. This is true since the light detector 74 of the light receiving unit 68 detected infrared light associated with the light signals generated by the light source unit 66. Hence, in step 308, the controller 82 communicates with the inlet valve 38 and the electric field generating device 50 in order to continue etching the semiconductor wafer 10 in the manner previously discussed. The procedure 300 then loops back to step 304 in order to generate subsequent infrared light signals to monitor the decreasing thickness of the semiconductor wafer 10 during etching thereof.

Returning now to step 306, if infrared light is not detected by the light detector 74 of the light receiving unit 68, the procedure 300 advances to step 310. In step 310, the controller 82 ceases etching of the semiconductor wafer 10. In particular, the controller 82 communicates with the gas inlet valve 38, the electric field generating device 50, and/or the outlet valve 44 in order to cease etching of the semiconductor wafer 10. More specifically, in order to stop or otherwise cease etching of the semiconductor wafer 10, the controller 82 may (1) cause the inlet valve 38 to be positioned in its closed position thereby preventing additional reactant gas from being advanced into the etching chamber 32, (2) deactuate the electric field generating device 50 thereby removing the electric field from within the etching chamber 32, and/or (3) cause the outlet valve 44 to be positioned in its open position thereby causing the reactant gas (and the plasma generated therefrom) to be evacuated from the etching chamber 32 via the outlet 42. However, it should be appreciated that the controller 82 may allow the etching system 30 to continue etching the semiconductor wafer 10 for a short, predetermined amount of time in order to further remove material from the semiconductor wafer 10. This further removal of material or overetching may be desirable after certain steps of a fabrication process. The procedure 300 then ends thereby placing the etching system 30 in an idle state until actuated to etch a subsequent semiconductor wafer.

While the invention has been illustrated and described in detail in the drawings and foregoing description, such illustration and description is to be considered as exemplary and not restrictive in character, it being understood that only a preferred embodiment has been shown and described and that all changes and modifications that come within the spirit of the invention are desired to be protected.

For example, in certain types of etching systems, it may be advantageous to utilize light signals reflected from the front side 22 of the wafer 10 instead of transmitting the light signals through the wafer 10. In such a situation, the light receiver array 64 would be positioned on the same side of the semiconductor wafer 10 as the light source array 62.

Moreover, in order to improve "across wafer" uniformity during etching, an array of gas inlets, each having an independently controlled inlet valve associated therewith, may be positioned radially at various locations over the semiconductor wafer 10 when the wafer 10 is positioned in the etching chamber. Each inlet valve could have a corresponding endpoint detector (i.e. a corresponding light source unit 66 and light receiving unit 68). In such an arrangement, individual portions (e.g. individual radial portions) of the semiconductor wafer 10 may be monitored to determine when a given portion is etched to the desired level 28. When a given portion has been etched to the desired level 28, the inlet valve corresponding to that portion (e.g. the inlet valve positioned above the portion) may be closed thereby reducing, or completely stopping, etching of the portion of the wafer 10 which has been etched to the desired level 28. Hence, such an arrangement would provide independent, multiple-point endpoint detection.

Yet further, as with the infrared light source unit 66, it should be appreciated that the light receiving unit 68 may alternatively be positioned outside of the etching chamber 32 such that infrared light signals emanating from the semiconductor wafer 10 (i.e. light signals either exiting the wafer 10 after being directed therethrough or light signals reflected from the wafer 10) are first directed through a sapphire window or the like positioned in a lower wall of the etching chamber 32 (as viewed in FIG. 2) and thereafter directed into the light receiving unit 68.

What is claimed is:

1. An apparatus for etching a first side of a semiconductor wafer down to a level, comprising:

an etching chamber;

a wafer chuck configured to (i) engage said wafer by a second side of said wafer, and (ii) position said wafer in said etching chamber;

a light source unit positioned such that light signals generated by said light source unit are directed toward said wafer;

a light detector positioned such that said light signals generated by said light source unit emanate from said wafer and are directed toward said light detector; and a light receiving unit positioned such that said light signals generated by said light source unit emanate from said wafer and are received with said light receiving unit, wherein said light signals upon reaching a specific intensity are refracted by said light receiving unit when said wafer has been etched down to said level such that said light signals generated by said light source unit are prevented from being detected by said light detector.

2. The apparatus of claim 1, wherein:

said light receiving unit includes a first optical material and a second optical material having an interface therebetween, said first optical material has a linear index of refraction which is dependent on an intensity level of said light signals received with said light receiving unit, said light signals are refracted at said interface if said linear index of refraction of said first optical material does not match said nonlinear index of refraction of said second optical material, and said linear index of refraction of said first optical material does not match said nonlinear index of refraction of said second optical material when said wafer has been etched down to said level.

3. The apparatus of claim 2, wherein:

said light detector is positioned such that said light signals emanating out of said first optical material and said second optical material are detected by said light detector, said light detector has a light detected mode of operation and a no-light detected mode of operation, said light detector operates in said light detected mode of operation when said light signals from said light source unit are unattenuated by said interface between said first optical material and said second optical material, and said light detector operates in said no-light detected mode of operation when said light signals from said light source unit are refracted by said interface between said first optical material and said second optical material.

4. The apparatus of claim 1, further comprising a gas inlet valve, wherein:

said gas inlet valve is fluidly coupled to (i) a reactant gas source, and (ii) said etching chamber, said gas inlet valve is positionable between (i) an open position in which said reactant gas is advanced from said reactant gas source to said etching chamber, and (ii) a closed position in which said reactant gas source is isolated from said etching chamber, and said gas inlet valve is positioned in said closed position when said light signals from said light source unit are refracted by said light receiving unit.

5. The apparatus of claim 4, wherein:

said light receiving unit is operatively coupled to said gas inlet valve, and said light receiving unit generates an output signal which causes said gas inlet valve to be positioned in said closed position when said light signals from said light source unit are refracted by said light receiving unit.

6. The apparatus of claim 1, wherein:

said light signals generated by said light source unit include infrared light signals, and said infrared light signals are directed toward said wafer by said light source unit.

7. The apparatus of claim 1, wherein:

said light receiving unit is secured to said wafer chuck such that said light signals generated by said light source unit emanate from said wafer and are received with said light receiving unit.

8. The apparatus of claim 1, further comprising an electric field generating device, wherein:

said electric field generating device is operable in either (i) an actuated mode of operation in which said electric field generating device generates an electric field within said etching chamber, or (ii) a deactuated mode of operation in which said electric field generating device does not generate said electric field within said etching chamber, and said electric field generating device is operated in said deactuated mode of operation when said light signals from said light source unit are refracted by said light receiving unit.

9. An apparatus for etching a first side of a semiconductor wafer down to a level, comprising:

an etching chamber;

a wafer chuck configured to (i) engage said wafer by a second side of said wafer, and (ii) position said wafer in said etching chamber;

a light source unit positioned such that light signals generated by said light source unit are directed into said wafer;

a light detector positioned such that said light signals generated by said light source emanate out of said wafer and are directed toward said light detector; and a light receiving unit positioned such that said light signals generated by said light source unit emanate out of said wafer and are received with said light receiving unit, wherein (i) said light receiving unit includes a first optical material and a second optical material having an interface therebetweeen, (ii) said first optical material has a linear index of refraction, (iii) said second optical material has a nonlinear index of refraction which is dependent on an intensity level of said light signals received with said light receiving unit, and (iv) said light signals are refracted at said interface if said linear index of refraction of said first optical material does not match said nonlinear index of refraction of said second optical material such that said light signals generated by said light source unit are prevented from being detected by said light detector.

10. The apparatus of claim 9, further comprising a gas inlet valve, wherein:

said gas inlet valve is fluidly coupled to (i) a reactant gas source, and (ii) said etching chamber, said gas inlet valve is positionable between (i) an open position in which said reactant gas is advanced from said reactant gas source to said etching chamber, and (ii) a closed position in which said reactant gas source is isolated from said etching chamber, and said gas inlet valve is positioned in said closed position when said light signals from said light source unit are refracted at said interface of said first optical material and said second optical material.

11. The apparatus of claim 10, wherein:

said light receiving unit further includes a light detector, said light detector has a light detected mode of operation and a no-light detected mode of operation, said light detector is operatively coupled to said gas inlet valve, said gas inlet valve is positioned in said open position when said light detector is positioned in said light detected mode of operation, and said gas inlet valve is positioned in said closed position when said light detector is positioned in said no-light detected mode of operation.

12. The apparatus of claim 9, wherein:

said light signals generated by said light source unit include infrared light signals, and said infrared light signals are directed into said wafer by said light source unit.

13. The apparatus of claim 9, wherein:

said light receiving unit is secured to said wafer chuck such that said light signals generated by said light source unit emanate out of said wafer and are received with said light receiving unit.

14. The apparatus of claim 9, further comprising an electric field generating device, wherein:

said electric field generating device is operable in either (i) an actuated mode of operation in which said electric field generating device generates an electric field within said etching chamber, or (ii) a deactuated mode of operation in which said electric field generating device does not generate said electric field within said etching chamber, and said electric field generating device is operated in said deactuated mode of operation when said light signals from said light source unit are refracted at said interface of said first optical material and said second optical material.

* * * * *